United States Patent [19]
Hirai et al.

[11] Patent Number: 4,683,146
[45] Date of Patent: Jul. 28, 1987

[54] PROCESS FOR PRODUCING DEPOSITION FILMS

[75] Inventors: Yutaka Hirai, Tokyo; Hiroshi Matsuda; Ken Eguchi, both of Yokohama; Masahiro Haruta, Funabashi; Yukuo Nishimura, Sagamihara; Takashi Nakagiri, Tokyo, all of Japan

[73] Assignee: Canon Kabushiki Kaisha, Tokyo, Japan

[21] Appl. No.: 722,467

[22] Filed: Apr. 12, 1985

[30] Foreign Application Priority Data

| Apr. 16, 1984 | [JP] | Japan | 59-74932 |
| Apr. 16, 1984 | [JP] | Japan | 59-74933 |
| Apr. 16, 1984 | [JP] | Japan | 59-74934 |
| Apr. 16, 1984 | [JP] | Japan | 59-74935 |
| Apr. 16, 1984 | [JP] | Japan | 59-74936 |
| Apr. 16, 1984 | [JP] | Japan | 59-74937 |

[51] Int. Cl.$^4$ .................................. B05D 3/06
[52] U.S. Cl. ........................... 427/54.1; 427/86
[58] Field of Search ............. 427/35, 36, 53.1, 54.1, 427/55, 86; 204/157.1 R; 423/348, 349, 350

[56] References Cited

U.S. PATENT DOCUMENTS

| 3,490,961 | 1/1970 | Frieser et al. | 204/157.1 R |
| 4,348,428 | 9/1982 | Rockley et al. | 427/54.1 |
| 4,363,828 | 12/1982 | Brodsky et al. | 427/39 |
| 4,448,801 | 5/1984 | Fukuda et al. | 427/54.1 |
| 4,495,218 | 1/1985 | Azuma et al. | 427/54.1 |

Primary Examiner—John H. Newsome
Attorney, Agent, or Firm—Fitzpatrick, Cella, Harper & Scinto

[57] ABSTRACT

A process for producing deposition films is provided which comprises forming a gaseous atmosphere of at least one compound silicon hydride selected from the group consisting of;
(A) straight chain silicon hydrides represented by the general formula $$Si_nH_{2n+2}$$

wherein n is an integer 4 or more;
(B) cyclic silicon hydrides unsubstituted or substituted by a linear or branched silicon hydride residue which are represented by the general formula $$Si_mH_{2m}$$

wherein m is 3, 4, 5, or 6; and
(C) branched chain silicon hydrides represented by the general formula $$Si_pH_q$$

wherein p is an integer of 4 or more and q is an interger of 10 or more;
in a reaction chamber containing a substrate, and exerting light energy on the atmosphere to excite and decompose the silicon hydride, thereby a silicon-containing layer on the substrate.

22 Claims, 2 Drawing Figures

PROCESS FOR PRODUCING DEPOSITION FILMS

BACKGROUND OF THE INVENTION

1. Field of the Invention

The present invention relates to a process best suited for producing silicon-containing deposition films, particularly amorphous silicon (hereinafter denoted by a-Si) or polycrystalline silicon deposition films useful as photoconductive films, semiconductor films, insulation films or the like.

2. Description of the Prior Art

It is known that a-Si deposition films are formed, for example, by utilizing glow discharge deposition process or thermal energy deposition processes using a raw material $SiH_4$ or $Si_2H_6$. That is, as is well known, $SiH_4$ or $Si_2H_6$ is excited and decomposed by applying electric or thermal energy, forming a-Si deposition films on substrates and utilizing these films for various purposes.

However, in the glow discharge deposition process using $SiH_4$ or $Si_2H_6$ as a raw material, the film during deposition under high output is much influenced by the discharge energy so that it is difficult to keep the film forming system under reproducible and stable conditions. In particular, this is remarkable in the formation of large and thick deposition films.

In the thermal energy deposition process the high operation temperature required will restrict the kinds of the employable substrates and will raise the probability of elimination of useful bound hydrogen atoms from the a-Si deposit, thus making it difficult to attain desired characteristics of the deposition film.

As stated above, when deposition films are formed by these methods using $SiH_4$ or $Si_2H_6$, difficulties remain unsolved in securing the constancy of electrical and optical characteristics and quality of the films and in eliminating irregularities on the film surface or defects in the film interior which are liable to develop during the deposition.

Such being the case, an a-Si deposition method applying light energy to a starting material $SiH_4$ or $Si_2H_6$ has been proposed recently to solve these problems and it is attracting attention. According to this deposition method employing light energy (hereinafter referred to as the "optical CVD process"), the above noted difficulties can markedly be diminished to on account of advantages of this process such as a low temperature permitted at the production of a-Si deposition films. However, since the optical CVD process utilizes a relatively low level of energy, i.e., light energy for the excitation of the starting material $SiH_4$ or $Si_2H_6$, not much higher efficiency of the decomposition can be expected. Thus the optical CVD process encounters another problem such that the improvement of film forming speed cannot be expected and there are difficulties in mass production.

SUMMARY OF THE INVENTION

The invention has been accomplished to solve the above problems.

Accordingly, an object of the invention is to provide a process for producing silicon-containing deposition films which permits increasing the film forming speed while keeping high quality of the films.

Another object of the invention is to provide a process for producing silicon-containing deposition films of high quality which permits securing uniform electrical and optical characteristics and constant quality of the films even in the production of large-area, thick deposition films as well.

According to the invention, there is provided a process for producing deposition films which comprises forming a gaseous atmosphere of at least one member selected from the group consisting of;

straight chain silicon hydrides represented by the general formula $Si_nH_{2n+2}$ . . . (A) wherein n is an integer of 4 or more; cyclic silicon hydrides unsubstituted or substituted by a linear or branched silicon hydride radical which are represented by the general formula $Si_mH_{2m}$ (B) wherein m is 3, 4, 5, or 6; and branched chain silicon hydrides represented by the general formula $Si_pH_q$ (C) wherein p is an integer of 4 or more and q is an integer of 10 or more; in a reaction chamber housing a substrate, and exerting light energy on the atmosphere to excite and decompose the silicon hydride, thereby depositing a silicon-containing film on the substrate.

Another object of the present invention is to provide a process for producing a deposition film which comprises forming a gaseous atmosphere of a straight chain silicon hydride compound represented by the general formula $Si_nH_{2n+2}$ in a chamber housing a substrate where n is an integer of 4 or more, and exerting light energy to excite and decompose the silicon hydride compound, thereby forming a silicon-containing film on a substrate.

Still another object of the invention is to provide a process for producing a deposition film which comprises forming a gaseous atmosphere of a cyclic silicon hydride compound represented by the general formula $Si_mH_{2m}$ unsubstituted or substituted by a silicon hydride radical in a chamber housing a substrate where m is 3, 4, 5 or 6, and exerting light energy on the atmosphere to excite and decompose the silicon hydride compound, thereby forming a silicon-containing film on a substrate.

A further object of the invention is to provide a process for producing a deposition film which comprises forming a gaseous atmosphere of a branched chain silicon hydride compound in a chamber housing a substrate, represented by a general formula $Si_pH_q$ where p is an integer of 4 or more and q is an integer of 10 or more, and exerting light energy to excite and decompose the silicon hydride compound, thereby forming a silicon containing deposition film on a substrate.

DETAILED DESCRIPTION OF THE INVENTION

Figure 2:
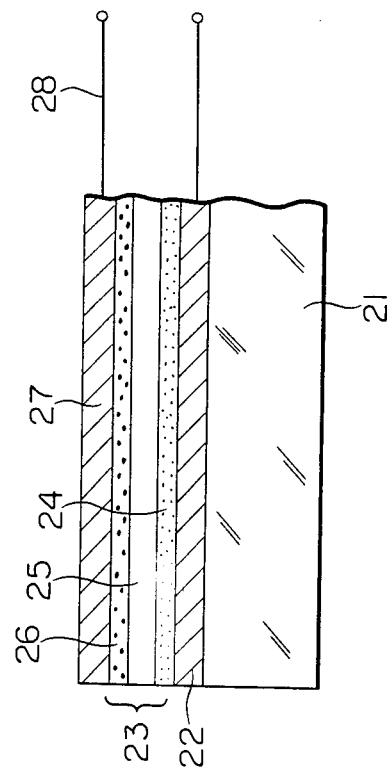
FIG. 2 is a cross-sectional view of a PIN type of diode made by the process of the invention.

The silicon-containing deposition films produced by the process of the invention may be either crystalline or amorphous and the linkages of silicon atoms in the films may be of any type from an oligomer to a polymer. The films may involve in the structure hydrogen atoms or halogen atoms which come from the starting materials used.

The embodiments of the invention will be described referring chiefly to a-Si deposit films.

While there is no particular upper limit of the number n of silicon atoms in the molecule of the straight chain silicon hydrides, used in the invention, represented by the general formula $Si_nH_{2n+2}$ (n is an integer of 4 or more), the number n is preferred to be up to 15, particularly up to 10.

The branched chain silicon hydrides, used in the invention, represented by the above general formula, include the branched chain silicon hydrides of the general formula $Si_pH_{2p+2}$ (p is as defined above) and compounds in which one or more hydrogen atoms in the molecule of the linear or branched chain silicon hydrides of the general formula $Si_pH_{2p+2}$ (p is as defined above) are substituted by a cyclic silanyl group. While there is no particular upper limit of p, it is preferred to be up to 15, particularly up to 10.

The cyclic silicon hydrides, used in the invention, of the above general formula include, for example, cyclopropasilane ($Si_3H_6$), cyclobutasilane ($Si_4H_8$), cyclopentasilane ($Si_5H_{10}$), and cyclohexasilane ($Si_6H_{12}$).

In the process of the invention, when the above defined silicon hydride made into gaseous state is excited and decomposed in the reaction chamber, halogen gas (e.g. $F_2$ gas, $Cl_2$ gas, $Br_2$ vapor, or $I_2$ vapor) is preferably introduced together with the silicon hydride vapor, since a free-radical-forming reaction of halogen atoms with Si and H occurs thereby, which promotes the excitation and decomposition of the silicon hydride and consequently the formation of deposition film. In addition, it is expected that halogen will become incorporated into the deposition film during the formation thereof, reduce the structural defects thereof, and act as a terminator combining with dangling bonds of Si, thus producing silicon films of good quality. Halogen can be introduced after splitting into free radicals.

In the process of the invention, the formation of the silicon-containing deposition film is carried out preferably under reduced pressure in a reaction chamber, although it is also feasible under ordinary or raised pressure.

The energy used in the invention for the excitation and decomposition of the silicon hydride compounds of formula mentioned above is confined to light energy. The silicon hydride compounds are characterized in that they can be readily excited and decomposed by affording relatively low energy such as optical energy to form silicon deposition films of good quality so that the substrate temperature can be kept relatively low during film formation. The excitation energy can be applied uniformly or topically to the material reaching the vicinity of the substrate. Using a suitable optical system, the entire area of the substrate surface can be irradiated to form the deposition film thereon or desired areas thereof can be selectively irradiated to form the film locally thereon. Alternatively, the areas according to a prescribed pattern, of the substrate surface can be irradiated by using a photoresist or by some other means, to form the deposition film according to the pattern. Thus optical energy can be used favorably.

Two or more of the above defined silicon hydride compounds can be used. In this case, the formed film has nearly average properties of the used compounds or synergistically improved properties.

The term "light energy" used herein means the energy of rays capable of affording sufficient excitation energy to the starting material gas on irradiation. Any rays capable of exciting and decomposing the starting material gas to deposit products of the decomposition can be used regardless of the wavelength region of the rays. Such rays include, for example, ultraviolet rays, visible rays, X-rays, and γ-rays, from which rays suited for the starting material gas are chosen.

In the process of the invention, deposition films containing an element of group III or V of the periodic table can be produced by introducing a compound of the element together with the silicon hydride. Such deposition films can be used as functional films including photoconductive films and semiconductor films, for various purposes.

Suitable elements for use in the invention include, as p-type impurities, group III-A elements, e.g. B, Al, Ga, In, and Tl and, as n-type impurities, group V-A elements, e.g. N, P, As, Sb, and Bi. In particular, B, Ga, P, and Sb are best suited. The amount of doping impurity is suitably chosen according to desired electrical and optical characteristics of the product film. Suitable doping amounts are from $3 \times 10^{-2}$ to 4 atomic % in the case of group III-A elements and from $5 \times 10^{-3}$ to 2 atomic % in the case of group V-A elements.

The compound containing such an element is desired to be gaseous under ordinary temperature and pressure conditions or at least under conditions for deposition film formation and to be readily vaporizable by means of a suitable vaporizer. Examples of such compounds are $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$. These compounds may be used separately or in combination.

Referring now to the drawings, the invention is descrbed.

Figure 1:
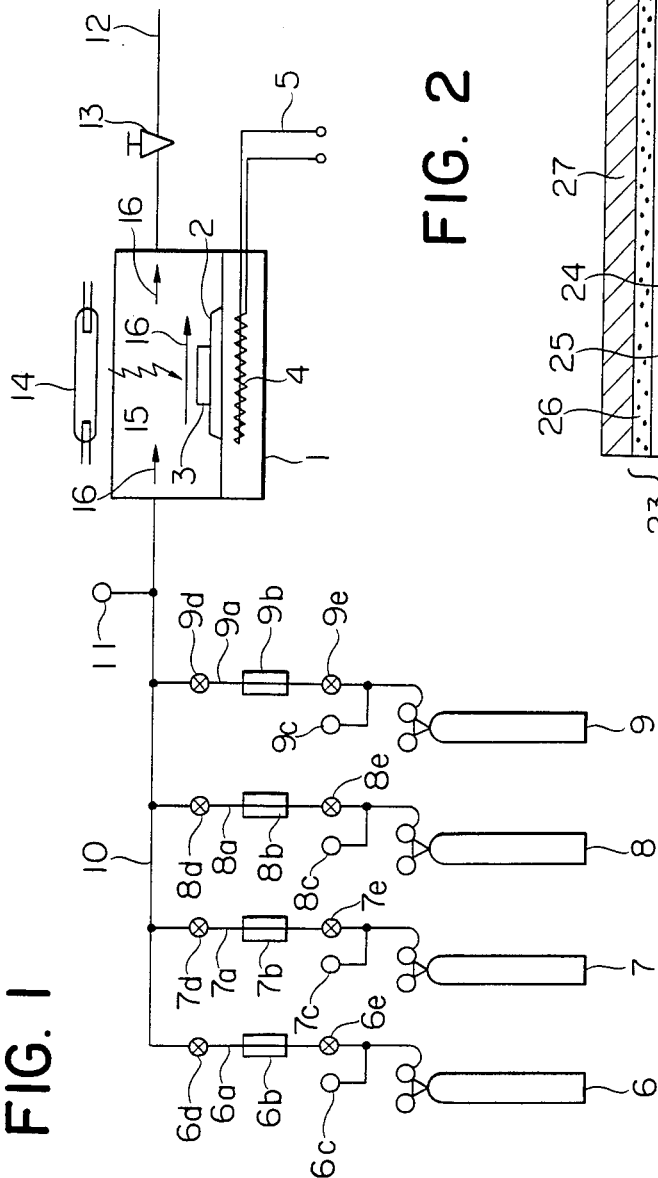
FIG. 1 is a schematic view illustrating the construction of a light energy irradiation type of deposition film forming apparatus used in the invention.

FIG. 1 is a schematic view illustrating an apparatus used in the process of the invention to produce a-Si deposition films for use as photoconductive films, semiconductor films, or insulation films.

In FIG. 1, the numeral 1 denotes a deposition chamber, in which a desired substrate 3 is placed on a substrate-supporting bed 2. The substrate 3 may be made of any of a conductor, semiconductor, and insulator. Conductive substrates usually employed herein are, for example, films or sheets of synthetic resins such as polyester, polyethylene, polyethylene, polycarbonate, cellulose acetate, polypropylene, polyvinyl chloride, polyvinylidene chloride, polystyrene, and polyamide, and glass plates, ceramic plates, and paper. On the substrate 3, an electrode layer or another silicon layer may be laminated previously.

The numeral 4 denotes a heater for the substrate. The heater 4 generates heat on supplying electric power through a load wire 5. The substrate temperature during film formation, though not particularly restricted, is desirably from 50° to 150° C., preferably from 100° to 150° C.

The numerals 6 to 9 denote feed gas sources. The gas source containing a liquid silicon hydride of the above-mentioned general formula is provided with a suitable vaporizer. Any of known types of vaporizers may be employed including the type of heating to boil the liquid feedstock and the type of passing a carrier gas through the liquid feedstock. The number of the feed gas sources is not confined to four sources but varies depending on the number of kinds of silicon hydride to be used, the number of kinds of other feed materials to be used such as halogen gas, carrier gas, diluent gas, and catalytic gas, and whether the silicon hydride and has been preliminarily mixed with any of the other feed materials to be used. In the figure, 6a to 9a are branch pipes, 6b to 9b are flow meters, 6c to 9c are each a pressure gauge for measuring the pressure of the higher pressure side of the flow meter, and 6d to 9d and 6e to 9e are each a valve for passing, stopping, or controlling the gas flow.

The feed gases from the gas sources are mixed together in a feed pipe 10, and driven by an evacuating system (not depicted) into the chamber 1. The numeral 11 denotes a pressure gauge for measuring the pressure of the gas mixture to be introduced into the chamber 1; 12 denotes an exhaust pipe connected to the evacuating system (not shown in the Figure) for evacuating the chamber 1 or withdrawing the introduced gas therefrom; 13 denotes a regulator valve. Before introducing the starting gas mixture, the chamber is evacuated to a pressure of desirably $5 \times 10^{-5}$ Torr or less, preferably $1 \times 10^{-6}$ Torr or less. After the starting gas mixture has been introduced into the chamber 1, the pressure therein is kept at a pressure of desirably $1 \times 10^{-2}$ to 100 Torrs, preferably $1 \times 10^{-2}$ to 1 Torr, during film forming operation.

An example of the excitation-energy supply source used in the invention is the light source denoted by 14, for which a mercury lamp, xenon lamp, carbon dioxide gas laser, argon ion laser, or excimer laser, for example, is used. The optical energy used in the process of the invention is not confined to ultraviolet light energy; regardless of the wavelength range, any light energy is applicable so far as it can excite and decompose the starting material gas to deposit the decomposition product. The invention also includes the case where light energy is absorbed by the starting gas or by the substrate and is converted into thermal energy, which causes the excitation and decomposition of the starting gas to form the deposition film. Rays 15 emitted from the light source 14 and directed by a suitable optical system to the entire area or intended portions of the substrate surface are absorbed by the starting gas flowing in the arrow direction (also absorbed by the substrate), thereby causing the excitation and decomposition of the starting material gas to deposit a-Si on the entire area or the intended portions of the substrate surface.

According to the process of the invention, deposition films of arbitrary thicknesses, from thin to thick films, as well as of arbitrary film area can be obtained as desired. The film thickness can be controlled in the usual way of manipulating the pressure, flow, and concentration of the starting gas and the quantity of excitation energy. For instance when generally photoconductive films, semiconductor films, or insulation films are produced, the thickness of a-Si films are chosen desirably from 500 to $5 \times 10^4$ Å, preferably from 1000 to 10,000 Å.

FIG. 2 is a cross-sectional view illustrating a typical PIN type of diode device, fabricated by carrying out the process of the invention, having a-Si deposition films doped with impurity elements, respectively.

This device comprises a substrate 21, film electrodes 22 and 27 and a semiconductor layer 23 which consists of a P-type of a-Si layer 24, I-type of a-Si layer 25, and N-type of a-Si layer 26. The lead wires 28 connect the electrodes to an external electric circuit device.

The film electrodes 22 and 27 are each formed of a thin layer of NiCr, Al, Cr, Mo, Au, Ir, Nb, Ta, V, Ti, Pt, Pd, $In_2O_3$, $SnO_2$, or ITO ($In_2O_3 + SnO_2$) on a substrate by vacuum deposition, electron beam vapor deposition, sputtering, or the like. The thickness of the electrode 22 is desirably from 30 to $5 \times 10^4$ Å, preferably from 100 to $5 \times 10^3$ Å.

The a-Si layer 23 can be formed as N-type film 26 or P-type film 24, depending on cases, by doping the layer during formation thereof with an N-type, P-type, or both types of impurities while controlling the concentration thereof in the feed.

In the invention, the flow rate of P-type and N-type impurity gases are determined according to the quantity of (silicon hydride gas flow rate)×(doping concentration).

However, the control of impurity gas flow is very complicated since the impurity gas is admixed in a trace amount. Therefore, the impurity gas is preferably stored and used at a state diluted by hydrogen gas.

The method of forming the semiconductor layer 23 is described below in more detail.

A substrate 21 overlaid with a thin layer electrode 22 is placed on the supporting bed 3 in the deposition chamber 1 as shown in FIG. 1. Air in the chamber 1 is withdrawn through the exhaust pipe 20 by means of the evacuating system to reduce the pressure in the chamber to $5 \times 10^{-5}$ Torr or less, preferably $10^{-6}$ Torr or less.

In this state, the heater 4 is energized to heat the substrate 21 on the supporting bed 2 to a prescribed temperature. Then, for the purpose of laminating a P-type of a-Si layer on the thin layer electrode 22 laid on the substrate 21, a mixture of an Si-supplying gas (the above defined silicon hydride in gaseous form) and a P-type impurity gas in a prescribed ratio is introduced into the chamber 1, where the flow rate of the P-type impurity gas is decided according to the quantity of (silicon hydride gas flow rate)×(doping concentration).

As stated above, it is generally desirable to use the impurity gas diluted previously with $H_2$ gas or the like, so as to facilitate the control of the impurity gas flow rate since the P-type or N-type of impurity gas to be admixed is extremely minor in quantity.

The introduced gas mixture is irradiated with light energy to deposit a P-type a-Si layer 24 on the electrode 22.

In the same manner, as non-doped, I-type a-Si layer 25 is formed on the layer 24 by introducing the Si-supplying starting gas and then an N-type a-Si layer 26 is formed the layer 25 by introducing the Si-supplying gas and a N-type impurity gas.

Finally, a film electrode 27 of the same thickness as that of the film electrode 22 is formed on the layer 26 in the same manner as in the case of the electrode 22, thus completing a PIN-type of diode device.

The respective thickness ranges of the P-type a-Si layer 24, I-type a-Si layer 25, and N-type a-Si layer 26 are; 100 to $10^4$ Å, preferably 300 to 2000 Å; 500 to $5 \times 10^4$ Å, preferably 1000 to 10,000 Å; and 100 to $10^4$ Å, preferably 300 to 2000 Å.

The invention is illustrated in more detail by way of the following examples.

EXAMPLE 1

An a-Si deposition film was formed by using the apparatus of FIG. 1 and $Si_4H_{10}$ as a straight chain silicon hydride compound of formula (A).

A substrate film made of polyethylene trephthalate was placed on the supporting bed 2, and the deposition chamber 1 was evacuated to a vacuum of $10^{-6}$ Torr with an evacuating system. At a substrate temperature shown in Table 1, said silicon hydride in a gaseous state (flow rate: 150 SCCM) and a halogen gas (flow rate: 20 SCCM) were introduced into the chamber 1 and irradiated with rays projected in a direction perpendicular to the substrate surface from a 1-KW Xe lamp under the pressure 0.1 Torr in the chamber, thus forming a 5000 Å thick I-type a-Si deposit film. The rate of the deposition was 35 Å/sec.

For comparison, an a-Si deposition film was formed by following the above procedure but using $Si_2H_6$. The rate of this deposition was 15 Å/sec.

Each of the thus prepared a-Si films was placed in a vapor deposition chamber. This chamber was evacuated to a vacuum of $10^{-6}$ Torr. Then Al was vapor-deposited on the a-Si film under a vacuum of $10^{-5}$ Torr at a deposition rate of 20 Å/sec to a thickness of 1500 Å, thus forming Al gap electrodes of comb type (250μ long, 5 mm wide).

The photocurrent (AM1, 100 mW/cm$^2$) and the dark current were measured by applying a voltage of 10 V to determine the photoconductivity σp and the ratio of photoconductivity σp to dark conductivity σd, thereby evaluating the a-Si films. Results thereof are shown in Table 1.

EXAMPLE 2

Following the procedure of Example 1 except for using straight chain silicon hydrides $Si_5H_{12}$, $Si_6H_{14}$, and $Si_7H_{16}$, respectively, in place of $Si_4H_{10}$, a-Si deposition films were formed and values of σp and σp/σd were determined. The results are shown in Table 1.

TABLE 1

| Si compound | $Si_4H_{10}$ | $Si_5H_{12}$ | $Si_6H_{14}$ | $Si_7H_{16}$ |
|---|---|---|---|---|
| Substrate temp. (°C.) | 80 | 80 | 80 | 80 |
| σp/σd | $10^5$ | $6 \times 10^4$ | $5 \times 10^4$ | $2 \times 10^4$ |
| σp (Ω · cm)$^{-1}$ | $4 \times 10^{-5}$ | $3 \times 10^{-5}$ | $3 \times 10^{-5}$ | $2 \times 10^{-5}$ |

As can be seen from Table 1, a-Si films exhibiting good σp and σp/σd are obtained according to the invention even at a low substrate temperature.

EXAMPLE 3

An N-type of a-Si deposition film doped with P and a P-type a-Si deposition film doped with B were formed in the following manner by using the apparatus of FIG. 1 and $PH_3$ and $B_2H_6$, respectively, as impurity-element-containing compounds, together with $Si_4H_{10}$ as a straight chain silicon hydride of the general formula.

A substrate film made of polyethylene terephthate was placed on the supporting bed 2, and the deposition chamber 1 was evacuated to a vacuum of $10^{-6}$ Torr with an evacuating system. At a substrate temperature shown in Table 2, gaseous $Si_4H_{10}$ (flow rate: 150 SCCM) mixed with $PH_3$ gas or $B_2H_6$ gas (each diluted with $H_2$ to 1000 ppm) (flow rate 40 SCCM) was introduced into the chamber and irradiated with rays projected in a direction perpendicular to the substrate surface from a 1-KW Xe lamp, while keeping the inner pressure of the chanber at 0.1 Torr, thus forming a doped a-Si film (700 Å thick). The rate of the deposition was 35 Å/sec.

For comparison, doped a-Si films was formed by following the above procedure but using $Si_2H_6$. The rate of the deposition was 15 Å/sec.

Then the a-Si film prepared was placed in a vapor-deposition chamber, and Al gap electrodes of comb type (250μ long, 5 mm wide) were formed on the a-Si film under a vacuum of $10^{-5}$ Torr. The dark current was measured by applying a voltage of 10 V to determine dark conductivities σd thereof and evaluate the a-Si films. The results are shown in Table 2.

EXAMPLES 4 AND 5

Following the procedure of Example 3 except for using $Si_5H_{12}$ and $Si_6H_{14}$, respectively, in place of $Si_4H_{10}$, doped a-Si films were prepared and the dark conductivities were determined. The results are shown in Table 2.

TABLE 2

|  | Example 3 | Example 4 | Example 5 |
|---|---|---|---|
| Silicon hydride | $Si_4H_{10}$ | $Si_5H_{12}$ | $Si_6H_{14}$ |
| Substrate temp. (°C.) | 60 | 60 | 60 |
| σd (N-type) (Ω · cm)$^{-1}$ | $4.5 \times 10^{-1}$ | $4.8 \times 10^{-1}$ | $4.1 \times 10^{-1}$ |
| σd (P-type) (Ω · cm)$^{-1}$ | $2.8 \times 10^{-2}$ | $3.0 \times 10^{-2}$ | $2.6 \times 10^{-2}$ |

As can be seen from Table 2, a-Si films exhibiting high σd values, viz. those sufficiently doped, are obtained even at a low substrate temperature according to the invention.

EXAMPLE 6

Using $Si_4H_{10}$ as a straight chain silicon hydride of the general formula and the apparatus of FIG. 1, a PIN-type of diode as shown in FIG. 2 was prepared in the following manner.

A polyethylene terephthalate film 21 overlaid with a 1000-Å thick ITO film 22 by vapor deposition was placed on the supporting bed, and the chamber 1 was evacuated to a vacuum of $10^{-6}$ Torr. Then gasified $Si_4H_{10}$ (flow rate: 150 SCCM) and diborane gas ($B_2H_6$ diluted with $H_2$ to 1000 ppm) were introduced into the chamber and irradiated with rays from a 1-KW Xe lamp while keeping the pressure at 0.1 Torr, thereby forming a P-type a-Si film 24 (700 Å thick) doped with B.

Secondly, an I-type a-Si film 25 (5000 Å thick) was formed on the film 24 in the same manner as the above but without introducing $B_2H_6$ gas.

Thirdly, an N-type a-Si film 26 (700 Å thick) doped with P was formed on the film 25 in the same manner as the above but by introducing phosphine gas ($PH_3$, diluted with $H_2$ to 1000 ppm) (flow rate: 40 SCCM) together with $S_4H_{10}$ gas and separately a halogen gas (flow rate: 20 SCCM). Further a 1000-Å thick Al electrode was formed by vapor deposition on the film 26, thus completing a PIN-type of diode.

For comparison, another PIN-type of diode was prepared by following the above procedure but using $Si_2H_6$.

The diode (surface area 1 cm$^2$) thus prepared was measured for I-V properties to evaluate the rectifying functions and the photovoltaic effect. The results of the evaluation are shown in Table 3.

The diode exhibited a conversion efficiency of a least 8.5%, open end voltage of 0.92 V, and short circuit current of 10.5 mA/cm$^2$ on irradiation with light incident on the substrate side at an intensity (AM1) of about 100 mW/cm$^2$.

EXAMPLES 7-9

PIN-type diodes were prepared by following the procedure of Example 3 but using $Si_5H_{12}$, $Si_6H_{14}$, and $Si_7H_{16}$, respectively, as straight chain silicon hydrides, in place of $Si_4H_{10}$. The results of evaluating the rectifying characteristics and photovoltaic effect of these diodes are shown in Table 3.

TABLE 3

|  | Example 6 | Example 7 | Example 8 | Example 9 |
|---|---|---|---|---|
| Silicon hydride | $Si_4H_{10}$ | $Si_5H_{12}$ | $Si_6H_{14}$ | $Si_7H_{16}$ |
| Substrate temp. (°C.) | 80 | 80 | 80 | 80 |
| Rectificaion ratio*[1] of diode | $2 \times 10^8$ | $8 \times 10^7$ | $5 \times 10^7$ | $2 \times 10^7$ |
| n-Value of diode*[2] | 1.25 | 1.3 | 1.4 | 1.4 |

Notes
*[1] Ratio of the regular-directional electric current to the reverse directional at a voltage of 1 V.
*[2] n-Value (quality factor) of the p-n junction in the electric current expression $$J = J_s \left\{ \exp\left(\frac{eV}{nkT}\right) - 1 \right\}.$$

As can be seen from Table 3, a-Si deposition films superior in optical-electrical properties can be obtained according to the invention even at a lower substrate temperature than according to the prior art.

EXAMPLE 10

An a-Si deposition film was formed in the following manner by using the apparatus of FIG. 1 and $Si_3H_6$ as a cyclic silicon hydride of the above-mentioned general formula.

A substrate polyethylene terephthalate film was placed on the supporting bed 2, and the reaction chamber 1 was evacuated to a vacuum of $10^{-6}$ Torr with an evacuating system. At a substrate temperature shown in Table 4, gaseous $Si_3H_6$ (flow rate: 150 SCCM) and a halogen gas (flow rate: 20 SCCM) were introduced into the chamber 1 and irradiated with rays projected perpendicularly to the substrate surface from a 1-KW Xe lamp, while keeping the inner pressure of the chamber at 0.1 Torr, thus forming an I-type a-Si deposition film 5000 Å thick. The rate of the deposition was 35 Å/sec.

For comparison, another a-Si deposition film was formed by following the above procedure but using $Si_2H_6$. The rate of this deposition was 15 Å/sec.

The a-Si film thus prepared was placed in a vapor-deposition chamber, and the chamber was evacuated to a vacuum of $10^{-6}$ Torr. Then Al was vapor-deposited on the a-Si film under a vacuum of $10^{-5}$ Torr at a deposition rate of 20 Å/sec to a thickness of 1500 Å, thus forming Al gap electrodes of comb type (250μ long, 5 mm wide). The photocurrent (AM1, 100 mW/cm²) and the dark current were measured by applying a voltage of 10 V to determine the photoconductivity $\sigma p$ and the ratio of photoconductivity $\sigma p$ to dark conductivity $\sigma d$, thereby evaluating the a-Si film. Results thereof are shown in Table 4.

EXAMPLE 11

Following the procedure of Example 10 but using $Si_4H_8$, $Si_5H_{10}$, and $Si_6H_{12}$, respectively, as cyclic silicon hydrides of formula the above-mentioned general, in place of $Si_3H_6$, a-Si deposition films were formed and then values of $\sigma p$ and $\sigma p/\sigma d$ were determined. The results are shown in Table 4.

TABLE 4

| Cyclic Si hydride | $Si_3H_6$ | $Si_4H_8$ | $Si_5H_{10}$ | $Si_6H_{12}$ |
|---|---|---|---|---|
| Substrate temp. (°C.) | 80 | 80 | 50 | Room temp. |
| $\sigma p/\sigma d$ | $10^5$ | $8 \times 10^4$ | $5 \times 10^4$ | $10^4$ |
| $\sigma p$ $(\Omega \cdot cm)^{-1}$ | $2 \times 10^{-5}$ | $2 \times 10^{-5}$ | $2 \times 10^{-5}$ | $10^{-5}$ |

As can be seen from Table 4, a-Si films exhibiting good $\sigma p$ and $\sigma p/\sigma d$ are obtained according to the invention even at low substrate temperature.

EXAMPLE 12

An N-type a-Si deposition film doped with P and a P-type a-Si deposition film doped with B were formed in the following manner by using the apparatus of FIG. 1 and $PH_3$ and $B_2H_6$, respectively, as impurity-element-containing compounds, together with $Si_5H_{10}$ as a cyclic silicon hydride of the general formula.

A substrate polyethylene terephthalate film was placed on the supporting bed 2, and the reaction chamber 1 was evacuated to a vacuum of $10^{-6}$ Torr with an evacuating system. At a substrate temperature of 50° C., gaseous $Si_5H_{10}$ (flow rate: 150 SCCM) mixed with $PH_3$ gas or $B_2H_6$ gas (each diluted with $H_2$ to 1000 ppm) (flow rate: 40 SCCM) was introduced into the chamber and irradiated with rays projected perpendicularly to the substrate such from a 1-KW Xe lamp, while keeping the inner pressure of the chamber at 0.1 Torr, thus forming a doped a-Si film (700 Å thick). The rate of the deposition was 35 Å/sec.

For comparison, doped a-Si films were formed by following the above procedure but using $Si_2H_6$. The rate of the deposition was 15 Å/sec.

Then the a-Si film thus prepared by using was placed in a vapor-deposition chamber and Al gap electrodes of comb type (250μ long, 5 mm wide), were formed on the a-Si film under a vacuum of $10^{-5}$ Torr. Dark current was measured on the resulting cells by applying a voltage of 10 V to determine dark conductivities thereof and evaluate the a-Si films. Results thereof are shown in Table 5.

EXAMPLES 13–15

Following the procedure of Example 12 but using $Si_3H_6$, $Si_6H_{12}$, and $Si_5H_9.SiH_3$, respectively, in place of $Si_5H_{10}$, a-Si films were prepared and the dark conductivities were determined. The results are as shown in Table 5.

TABLE 5

|  | Example 12 | Example 13 | Example 14 | Example 15 |
|---|---|---|---|---|
| Cyclic silicon hydride | $Si_5H_{10}$ | $Si_3H_6$ | $Si_6H_{12}$ | $Si_5H_9.SiH_3$ |
| Substrate temp. (°C.) | 50 | 80 | 90 | Room temp. |
| $\sigma d$ (N-type) $(\Omega \cdot cm)^{-1}$ | $7.9 \times 10^{-1}$ | $8.1 \times 10^{-1}$ | $8.0 \times 10^{-1}$ | $6.5 \times 10^{-1}$ |
| $\sigma d$ (P-type) $(\Omega \cdot cm)^{-1}$ | $7.1 \times 10^{-2}$ | $5.8 \times 10^{-2}$ | $8.2 \times 10^{-2}$ | $5.4 \times 10^{-2}$ |

As can be seen from Table 5, a-Si films exhibiting high $\sigma$ values, viz. those sufficiently doped, are obtained according to the invention even at low substrate temperatures.

EXAMPLE 16

Using $Si_3H_6$ as a cyclic silicon hydride of the above-mentioned general formula and the apparatus of FIG. 1, a PIN-type of diode as shown in FIG. 2 was prepared in the following manner.

A polyethyelene terephthalate film 21 overlaid with a 1000-Å thick ITO film 22 by vapor deposition was placed on the supporting bed, and the reaction chamber 1 was evacuated to a vacuum of $10^{-6}$ Torr. Then gasified $Si_3H_6$ (flow rate: 150 SCCM) and diborane gas ($B_2H_6$ diluted with $H_2$ to 1000 ppm) were introduced into the chamber and irradiated with rays from a 1-KW Xe lamp while keeping the pressure at 0.1 Torr, thereby forming a P-type a-Si film 24 (700 Å thick) doped with B.

Secondly, an I-type a-Si film 25 (5000 Å thick) was formed on the film 24 in the same manner as the above but without introducing $B_2H_6$ gas.

Thirdly, an N-type a-Si film 26 (700 Å thick) doped with P was formed on the film 25 in the same manner as the above but by introducing phophine gas ($PH_3$, diluted with $H_2$ to 1000 ppm) (flow rate: 40 SCCM) together with $Si_3H_6$ gas and separately a halogen gas (flow rate: 20 SCCM). Further a 1000-Å thick Al electrode 27 was formed by vacuum deposition on the film 26, thus completing a PIN-type of diode.

For comparison, another PIN-type of diode was prepared by following the above procedures but using $Si_2H_6$.

The diode (surface area/cm$^2$) thus obtained was measured for I-V properties to evaluate the rectifying function and the photovoltaic effect. Results of the evaluation are shown in Table 6.

On irradiation with light incident on the substrate side at an intensity AM1 (about 100 mW/cm$^2$), this diode exhibited a conversion efficiency of at least 8.5%, an open end voltage of 0.92 V, and a short circuit current of 10.5 mA/cm$^2$.

EXAMPLE 17-19

PIN-type diodes were prepared by following the procedure of Example 16 but using $Si_4H_8$, $Si_5H_{10}$, and $Si_6H_{12}$, respectively, as the cyclic silicon hydrides of the above-mentioned general formula, in place of $Si_3H_6$. The results of evaluating the rectifying functions and photovoltaic effect of these diodes were as shown in Table 6.

TABLE 6

|  | Example 16 | Example 17 | Example 18 | Example 19 |
|---|---|---|---|---|
| Cyclic silicon hydride | $Si_3H_6$ | $Si_4H_8$ | $Si_5H_{10}$ | $Si_6H_{12}$ |
| Substrate temp. (°C.) | 80 | 80 | 50 | Room temp. |
| Rectificaion ratio*[1] of diode | $8 \times 10^7$ | $4 \times 10^7$ | $3 \times 10^7$ | $6 \times 10^6$ |
| n-Value of diode*[2] | 1.3 | 1.4 | 1.4 | 1.5 |

Notes
*[1]Ratio of the regular-directional electric current to the reverse-directional at a voltage of 1 V.
*[2]n-Value (quality factor) of the p-n junction in the electric current expression $$J = Js\left(\exp.\left(\frac{eV}{nkT}\right) - 1\right).$$

As can be seen from Table 6, a-Si deposition films superior in optical-electrical properties can be obtained according to the invention even at lower substrate temperature than according to the prior art.

EXAMPLE 20

An a-Si deposition film was formed in the following manner by using the apparatus of FIG. 1 and $SiH_3.SiH(SiH_3).SiH_3$ as a branched chain silicon hydride of the above-mentioned general formula.

A substrate film made from polyethylene terephthalate was placed on the supporting bed 2, and the reaction chamber 1 was evacuated to a vacuum of $10^{-6}$ Torr with an evacuating system. At a substrate temperature of 80° C., gaseous the silicon hydride (flow rate: 150 SCCM) and a halogen gas (flow rate: 20 SCCM) were introduced into the chamber 1 and irradiated with rays projected perpendicularly to the substrate surface from a 1-KW Xe lamp while keeping the inner pressure of the chamber at 0.1 Torr, thus forming an I-type a-Si deposition film 5000 Å thick. The rate of the deposition was 35 Å/sec.

For comparison, another a-Si deposition film was formed by following the above procedure but using $Si_2H_6$. The rate of this deposition was 15 Å/sec.

Each of the a-Si film prepared by using said branched chain silicon hydride was placed in a vapor-deposition chamber, and it was evacuated to a vacuum of $10^{-6}$ Torr. Then Al was vapor-deposited on the a-Si film under a vacuum of $10^{-5}$ Torr at a deposition rate of 20 Å/sec to a thickness of 1500 Å, thus forming Al gap electrodes of comb type (250μ long, 5 mm wide). The photocurrent (AM1, 100 mM/cm$^2$) and the dark current were measured by applying a voltage of 10 V to determine the photoconductivity $\sigma p$ and the ratio of photoconductivity to dark conductivity $\sigma d$, thereby evaluating the a-Si film. The results are shown in Table 7.

EXAMPLE 21

Following the procedure of Example 20 but using the branched chain silicon hydrides, respectively, in place of $SiH_3.SiH(SiH_3).SiH_3$, a-Si deposition films were formed and then values of $\sigma p$ and $\sigma p/\sigma d$ were determined. The results are shown in Table 7.

TABLE 7

| Si Compound | $SiH_3$<br>\|<br>$SiH_3.SiH$<br>\|<br>$SiH_3$ | $SiH_3$<br>\|<br>$SiH_3.SiH$<br>\|<br>$S_2H_5$ | $SiH_3$<br>\|<br>$SiH_3.SiH$<br>\|<br>$Si_3H_7$ | $Si_2H_5$<br>\|<br>$SiH_3$—$SiH$<br>\|<br>$Si_2H_5$ |
|---|---|---|---|---|
| Substrate temp. (°C.) | 80 | 80 | 80 | 80 |
| $\sigma p/\sigma d$ | $10^5$ | $5 \times 10^4$ | $4 \times 10^4$ | $10^4$ |
| $\sigma p(\Omega \cdot cm)^{-1}$ | $4 \times 10^{-5}$ | $2 \times 10^{-5}$ | $2 \times 10^{-5}$ | $10^{-5}$ |

As can be seen from Table 7, a-Si films exhibiting good $\sigma p$ and $\sigma p/\sigma d$ are obtained according to the invention even at a low substrate temperature.

EXAMPLE 22

An N-type a-Si deposition film doped with P and a P-type a-Si deposition film doped with B were formed in the following manner by using the apparatus of FIG. 1 and $PH_3$ and $B_2H_6$, respectively, as impurity-element-containing compounds, together with the branched chain silicon hydride $SiH_3.SiH(SiH_3).SiH_3$.

A substrate polyethylene terephthalate film was placed on the supporting bed 2, and the reaction chamber 1 was evacuated to a vacuum of $10^{-6}$ Torr with an evacuating system. At a substrate temperature shown in Table 8, gaseous $Si_4H_{10}$ (flow rate: 150 SCCM) mixed with $PH_3$ gas or $B_2H_6$ gas (each diluted with $H_2$ to 1000 ppm) (flow rate: 40 SCCM) was introduced into the chamber and irradiated with rays projected perpendicularly to the substrate surface from a 1-KW Xe lamp, while keeping the inner pressure of the chamber at 0.1 Torr, thus forming a doped a-Si film (700 Å thick). The rate of the deposition was 35 Å/sec.

For comparison, doped a-Si films were formed by following the above procedure but using $Si_2H_6$. The rate of the deposition was 15 Å/sec.

The a-Si film thus prepared was placed in a vapor-deposition chamber, and Al gap electrodes of comb type (250μ long, 5 mm wide) were formed on the a-Si film under a vacuum of $10^{-5}$ Torr. The dark current was measured by applying a voltage of 10 V to determine dark conductivities thereof and evaluate the a-Si films. The results are shown in Table 8.

EXAMPLES 23 AND 24

Following the procedure of Example 22 but using severally branched chain silicon hydrides shown in Table 8, in place of $SiH_3.SiH(SiH_3).SiH_3$, doped a-Si films were prepared and the dark conductivities were measured. The results are as shown in Table 8.

TABLE 8

|  | Example 22 | Example 23 | Example 24 |
|---|---|---|---|
| Silicon hydride | $Si_4H_{10}$ | $Si_5H_{12}$ | $Si_6H_{14}$ |
| Substrate temp. (°C.) | 80 | 80 | 80 |
| σd (N-type) $(\Omega \cdot cm)^{-1}$ | $5.3 \times 10^{-1}$ | $3.9 \times 10^{-1}$ | $3.7 \times 10^{-1}$ |
| σd (P-type) $(\Omega \cdot cm)^{-1}$ | $4.1 \times 10^{-2}$ | $4.0 \times 10^{-2}$ | $2.9 \times 10^{-2}$ |

As can be seen from Table 8, a-Si films exhibiting high σ values, viz. those sufficiently doped, are obtained according to the invention even at a low substrate temperature.

EXAMPLE 25

Using $Si_4H_{10}$ which is the same compound used in Example 22 and the apparatus of FIG. 1, a PIN-type of diode as shown in FIG. 2 was prepared in the following manner.

A polyethylene terephthate film 21 overlaid with a 1000-Å thick ITO film 22 by vapor deposition was placed on the supporting bed, and the reaction chamber 1 was evacuated to a vacuum of $10^{-6}$ Torr. Then the gasified $Si_4H_{10}$ (flow rate: 150 SCCM) and diborane ($B_2H_6$ diluted with $H_2$ to 1000 ppm) were introduced into the chamber and irradiated with rays from a 1-KW Xe lamp while keeping the pressure at 0.1 Torr, thereby forming a P-type a-Si film 24 (700 Å thick) doped with B.

Secondly, an I-type a-Si film 25 (5000 Å thick) was formed on the film 24 in the same manner as the above but without introducing $B_2H_6$ gas.

Thirdly, an N-type a-Si film 26 (700 Å thick) doped with P was formed on the film 25 in the same manner as the above but by introducing phosphine gas ($PH_3$, diluted with $H_2$ to 1000 ppm) (flow rate: 40 SCCM) together with $Si_4H_{10}$ gas and separately a halogen gas (flow rate: 20 SCCM). Further, a 1000-Å thick Al electrode 27 was formed by vacuum deposition on the film 26, thus completing a PIN-type of diode.

For comparison, another PIN-type of diode was prepared by following the above procedure but using $Si_2H_6$.

The diode element (surface area 1 $cm^2$) thus obtained was measured for I-V properties to evaluate the rectifying function and photovoltaic effect thereof. The results of the evaluation are shown in Table 9.

On irradiation with light incident on the substrate side at an intensity AM1 of about 100 mW/$cm^2$, thus diode exhibited a conversion efficiency of at least 8.5%, open end voltage of 0.92 V, and short circuit current of 10.5 mA/$cm^2$.

EXAMPLES 26-28

PIN-type diodes were prepared by following the procedure of Example 25 but using $Si_4H_8$, $Si_5H_{10}$, and $Si_6H_{12}$, respectively, as cyclic silicon hydrides of the above-mentioned general formula in place of branched $C_3H_6$. Results of evaluating the rectifying characteristics and photovoltaic effect of these diodes are shown in Table 9.

TABLE 9

|  | Example 25 | Example 26 | Example 27 | Example 28 |
|---|---|---|---|---|
| Silicon hydride | $Si_4H_{10}$ | $Si_5H_{12}$ | $Si_6H_{14}$ | $Si_7H_{16}$ |
| Substrate temp. (°C.) | 80 | 80 | 80 | 80 |
| Rectification*[1] ratio of diode | $9 \times 10^7$ | $7 \times 10^7$ | $5 \times 10^7$ | $10^7$ |
| n-Value of diode*[2] | 1.3 | 1.4 | 1.4 | 1.45 |

Notes *[1] and *[2]: The same as in Table 3.

As can be seen from Table 9, a-Si deposit films superior in optical-electrical properties can be obtained according to the invention even at a lower substrate temperature than according to the prior art.

As described hereinbefore, silicon deposition films of high quality can be formed according to the invention at low substrate temperatures and at high rates of the deposition. In addition, the invention has the special unprecedented effect of making it possible to secure the films of uniform electrical-optical properties and constant quality even when the films are thick and large in area. Moreover the process of the invention is advantageous in that since the high-temperature heating of the subtrates is unnecessary, the energy can be converted, less heat-resistant substrates can be used, and the time for the film production can be shortened on account of the low temperature treatment, and in that the raw material compounds can be readily synthesized at low costs and are superior in stability and little hazardous to handle.

What is claimed is:

1. A photolytic process for producing a deposition film which comprises forming a gaseous atmosphere of at least one silicon hydride compound selected from the group consisting of
   (A) straight chain silicon hydrides represented by the general formula $Si_nH_{2n+2}$ wherein n is an integer of 5 or more;
   (B) cyclic silicon hydrides unsubstituted or substituted by a linear or branched silicon hydride radical which are represented by the general formula $Si_mH_{2m}$ wherein m is 3, 4, 5 or 6; and
   (C) branched chain silicon hydrides represented by the general formula $Si_pH_q$ wherein p is an integer of 5 or more and q is an integer of 12 or more;
in a chamber having a substrate, and exerting light energy on the atmosphere to excite and decompose the silicon hydride compound, thereby forming a silicon-containing film on the substrate, whereby the film forming may be carried out at a substrate temperature on the order of about 50° to 150° C. and without application of thermal energy to excite and decompose the compounds.

2. The process of claim 1, wherein the silicon hydride compound used is a straight chain silicon hydride represented by the general formula $Si_nH_{2n+2}$ where n is an integer of 5 or more.

3. The process of claim 1, wherein the silicon hydride compound used in a cyclic silicon hydride unsubstituted or substituted by one or more linear or branched silicon hydride radicals which is represented by the general formula $Si_mH_{2m}$, where m is 3, 4, 5, or 6.

4. The process of claim 1, wherein the silicon hydride compound used is a branched chain silicon hydride represented by the general formula $Si_pH_q$, where p is an integer of 5 or more and q is an integer of 12 or more.

5. The process of claim 1, wherein a compound containing an element of group III or V of the periodic table is introduced additionally into the chamber.

6. The process of claim 4, wherein a halogen compound is introduced additionally into the chamber.

7. The process of claim 6, wherein the halogen compound is selected from the group consisting of $F_2$, $Cl_2$, $Br_2$, and $I_2$.

8. The process of claim 5, wherein the element of group III of the periodic table is selected from the group consisting of B, Al, Ga, In, and Tl.

9. The process of claim 5, wherein the element of group V of the periodic table is selected from the group consisting of N, P, As, Sb, and Bi.

10. The process of claim 1, wherein the light energy is selected from the group consisting of ultraviolet rays, infrared rays, visible rays, x-rays, and γ-rays.

11. The process of claim 1, wherein the means of supplying the light energy is selected from the group consisting of mercury lamps, xenon lamps, carbon dioxide gas lasers, argon ion lasers, and excimer lasers.

12. A photolytic process for producing a multi-layer deposition film having at least a first undoped layer containing silicon atoms and a second doped layer in contact with said first layer, said second layer containing silicon atoms and atoms of a Group III or Group V element on a substrate which comprises:
    a. forming the first layer containing silicon atoms by forming a gaseous atmosphere of at least one silicon hydride compound selected from the group consisting of:
       (A) straight chain silicon hydrides represented by the general formula $Si_nH_{2n+2}$ wherein n is an integer of 4 or more;
       (B) cyclic silicon hydrides unsubstituted or substituted by a linear or branched silicon hydride radical which are represented by the general formula $Si_mH_{2m}$ wherein m is 3, 4, 5 or 6; and
       (C) branched chain silicon hydrides represented by the general formula $Si_pH_q$ wherein p is an integer of 4 or more and l is an integer of 10 or more in a chamber housing the substrate and exerting light energy on the atmosphere to excite and decompose the silicon hydride compound; and
    b. forming the second layer containing silicon atoms and atoms of a Group III or Group V element by forming a gaseous atmosphere of (i) at least one silicon hydride compound selected from the group consisting of said (A), (B) or (C) and (ii) a compound containing atoms of a Group III or Group V element; in a chamber housing the substrate, and exerting light energy on the atmosphere to excite and decompose said compounds (i) and (ii).

13. The process of claim 12, wherein the silicon hydride compound used is a straight chain silicon hydride represented by the general formula $Si_nH_{2n+2}$ where n is an integer of 4 or more.

14. The process of claim 12, wherein the silicon hydride compound used is a cyclic silicon hydride unsubstituted or substituted by one or more linear or branched silicon hydride radicals which are represented by the general formula $Si_mH_{2m}$, where m is 3, 4, 5 or 6.

15. The process of claim 12, wherein the silicon hydride compound used is a branched chain silicon hydride represented by the general formula $Si_pH_q$, where p is an integer of 4 or more and q is an integer of 10 or more.

16. The process of claim 12, wherein a halogen compound is introduced additionally into the chamber.

17. The process of claim 16, wherein the halogen compound is selected from the group consisting of $F_2$, $Cl_2$, $Br_2$, and $I_2$.

18. The process of claim 12, wherein the element of Group III of the periodic table is selected from the group consisting of B, Al, Ga, In, and Tl.

19. The process of claim 12, wherein the element of group V of the periodic table is selected from the group consisting of N, P, As, Sb, and Bi.

20. The process of claim 12, wherein the light energy is selected from the group consisting of ultraviolet rays, infrared rays, visible rays, x-rays, and gamma-rays.

21. The process of claim 12, wherein the means of supplying the light energy is selected from the group consisting of mercury lamps, xenon lamps, carbon dioxide gas lasers, argon ion lasers, and excimer lasers.

22. A process according to claim 1 including maintaining the substrate temperature from about 50° to 150° C. during film formation.

* * * * *

UNITED STATES PATENT AND TRADEMARK OFFICE
CERTIFICATE OF CORRECTION

PATENT NO. : 4,683,146

DATED : July 28, 1987

INVENTOR(S) : YUTAKA HIRAI, ET AL.

It is certified that error appears in the above-identified patent and that said Letters Patent is hereby corrected as shown below:

AT [57] IN THE ABSTRACT

Line 4, "consisting of;" should read --consisting of:--.
Under (B)/Lines 2-3, "residue" should read --radical--.
Under (C)/Line 5, "interger" should read --integer--.
Line 21, "thereby a" should read --thereby forming a--.

COLUMN 1

Line 15, "using a" should read --using as a--.
Line 45, "above noted" should read --above-noted--.
Line 46, "to" should be deleted.

COLUMN 2

Line 6, "of;" should read -- of:--.
Line 46, "silicon containing" should read --silicon-containing--.

COLUMN 3

Line 19, "above de-" should read --above-de- --.
Line 58, "above defined" should read --above-defined--.

COLUMN 4

Line 30, "descrbed." should read --described.--.
Line 41, "polyethylene, polyethylene," should read --polyethylene,--.
Line 49, "load" should read --lead--.
Line 64, "and has" should read --has--.

UNITED STATES PATENT AND TRADEMARK OFFICE
CERTIFICATE OF CORRECTION

PATENT NO. : 4,683,146

DATED : July 28, 1987

INVENTOR(S) : YUTAKA HIRAI, ET AL.

It is certified that error appears in the above-identified patent and that said Letters Patent is hereby corrected as shown below:

COLUMN 5

Line 17, "Torrs," should read --Torr,--.

COLUMN 6

Line 26, "above defined" should read --above-defined--.
    Line 39, "as" should read --a--.
    Line 42, "formed the" should read --formed on the--.
    Line 43, "a" should read --an--.
    Line 50, "are;" should read --are:--.
    Line 51, "$5 \times 10^4 Å,$" should read --$5 \times 10^4$ Å,--.
    Line 60, "trephthalate" should read --terephthalate--.

COLUMN 7

Line 1, "pressure 0.1" should read --pressure of 0.1--.
    Line 2, "deposite" should read --deposition--.
    Line 45, "terephthate" should read --terephthalate--.
    Line 56, "chanber" should read --chamber--.
    Line 59, "was" should read --were--.

COLUMN 8

Line 56, "open end" should read --open-end--.
    Line 56, "short circuit" should read --short-circuit--.

COLUMN 9

Line 57, "formula the above-mentioned general," should read --the above-mentioned general formula,--.

UNITED STATES PATENT AND TRADEMARK OFFICE
CERTIFICATE OF CORRECTION

PATENT NO.   : 4,683,146
DATED        : July 28, 1987
INVENTOR(S)  : YUTAKA HIRAI, ET AL.

It is certified that error appears in the above-identified patent and that said Letters Patent is hereby corrected as shown below:

COLUMN 10

Line 20,   "such" should read --surface--.
    Line 27,   "by using" should be deleted.
    Line 65,   "polyethyelene" should read --polyethylene--.

COLUMN 11

Line 12,   "phophine" should read --phosphine--.
    Line 27,   "open end" should read --open-end--.
    Line 27,   "short circuit" should read --short-circuit--.
    Line 30,   "EXAMPLE 17-19" should read --EXAMPLES 17-19--.
    Line 58,   "perature" should read --peratures--.

COLUMN 12

Line 1,    "the" should be deleted.
    Line 12,   "film" should read --films--.

COLUMN 12/TABLE 7

Line 37,   "$S_2H_5$" should read --$Si_2H_5$--.

COLUMN 13

Line 35,   "terephthate" should read --terephthalate--.
    Line 65,   "thus" should read --this--.
    Line 67,   "open end" should read --open-end-.
    Line 67,   "short circuit" should read --short-circuit--.

UNITED STATES PATENT AND TRADEMARK OFFICE
CERTIFICATE OF CORRECTION

PATENT NO. : 4,683,146

DATED : July 28, 1987

INVENTOR(S) : YUTAKA HIRAI, ET AL.

It is certified that error appears in the above-identified patent and that said Letters Patent is hereby corrected as shown below:

COLUMN 14

Line 20, "deposit" should read --deposited--.
Line 33, "subtrates" should read --substrates--.
Line 33, "converted," should read --conserved,--.
Line 44, "consisting of" should read --consisting of:--.

COLUMN 15

Line 10, "in" should read --is--.

COLUMN 16

Line 9, "1" should read --q--.
Line 10, "more in" should read --more; ¶ in--.
Line 20, "element; in" should read --element; ¶ in--.
Line 46, "group V" should read --Group V--.

Signed and Sealed this

Twenty-second Day of December, 1987

Attest:

DONALD J. QUIGG

Attesting Officer

Commissioner of Patents and Trademarks